(12) United States Patent
Singh et al.

(10) Patent No.: US 9,693,488 B2
(45) Date of Patent: Jun. 27, 2017

(54) ELECTRONIC ASSEMBLY WITH ONE OR MORE HEAT SINKS

(71) Applicant: Deere & Company, Moline, IL (US)

(72) Inventors: Brij N. Singh, West Fargo, ND (US);
Thomas Roan, Fargo, ND (US);
Andrew D. Wieland, Fargo, ND (US);
Neal D. Clements, Sheldon, ND (US)

(73) Assignee: DEERE & COMPANY, Moline, IL (US)

( * ) Notice: Subject to any disclaimer, the term of this patent is extended or adjusted under 35 U.S.C. 154(b) by 87 days.

(21) Appl. No.: 14/689,445

(22) Filed: Apr. 17, 2015

(65) Prior Publication Data

US 2016/0242313 A1 Aug. 18, 2016

Related U.S. Application Data

(60) Provisional application No. 62/115,719, filed on Feb. 13, 2015.

(51) Int. Cl.
*H05K 7/20* (2006.01)
*H01L 23/473* (2006.01)
(Continued)

(52) U.S. Cl.
CPC ....... *H05K 7/20927* (2013.01); *H01L 23/473* (2013.01); *H05K 1/184* (2013.01);
(Continued)

(58) Field of Classification Search
CPC . G06F 1/181–1/182; H05K 7/20218–7/20381;
(Continued)

(56) References Cited

U.S. PATENT DOCUMENTS

| 4,004,195 A | 1/1977 | Harayda et al. |
| 4,104,700 A * | 8/1978 | Hutchison ............. H01L 23/427 |
| | | 257/E23.088 |

(Continued)

OTHER PUBLICATIONS

Griffin, G. A Design and Manufacturing Guide for the Lead Frame Chip Scale Package (LFCSP). Analog Devices, 2006, pp. 1-16 [application note] [online], [retrieved on Apr. 21, 2015]. Retrieved from the Internet <URL: http://www.analog.com/media/en/technical-documentation/application-notes/AN-772.pdf>.
(Continued)

*Primary Examiner* — Anthony Haughton
*Assistant Examiner* — Razmeen Gafur

(57) ABSTRACT

An electronic assembly comprises a semiconductor device that has conductive pads on a semiconductor first side and a metallic region on a semiconductor second side opposite the first side. A lead frame provides respective separate terminals that are electrically and mechanically connected to corresponding conductive pads. A first heat sink comprises a first component having a mating side. A portion of the mating side is directly bonded with the metallic region of the semiconductor device. A circuit board has an opening for receiving the semiconductor device. The lead frame extends outward toward the circuit board or a board first side of the circuit board.

17 Claims, 10 Drawing Sheets

(51) Int. Cl.
  *H05K 1/18* (2006.01)
  *H05K 3/00* (2006.01)
  *H05K 1/02* (2006.01)
  *H01L 23/495* (2006.01)
  *H01L 23/40* (2006.01)

(52) U.S. Cl.
  CPC ...... *H05K 3/0061* (2013.01); *H01L 23/49562* (2013.01); *H01L 2023/4056* (2013.01); *H05K 1/0209* (2013.01); *H05K 2201/09063* (2013.01)

(58) Field of Classification Search
  CPC ..................... H05K 7/20409–7/20418; H05K 7/20009–7/202; H01L 23/46–23/3677
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
  See application file for complete search history.

(56) References Cited

U.S. PATENT DOCUMENTS

| | | | |
|---|---|---|---|
| 5,471,011 A | 11/1995 | Maslakow | |
| 5,847,929 A | 12/1998 | Bernier et al. | |
| 7,582,951 B2 | 9/2009 | Zhao et al. | |
| 7,800,219 B2 | 9/2010 | Jeon et al. | |
| 2001/0026441 A1* | 10/2001 | Nakamura | H01L 23/3677 361/720 |
| 2005/0248921 A1 | 11/2005 | Schmidt et al. | |
| 2006/0039127 A1* | 2/2006 | West | H02M 7/003 361/803 |
| 2007/0108585 A1* | 5/2007 | Pavier | H01L 23/3675 257/690 |
| 2007/0138606 A1* | 6/2007 | Brailey | H01L 23/3675 257/666 |
| 2007/0230127 A1* | 10/2007 | Peugh | H01L 23/053 361/699 |
| 2008/0272483 A1* | 11/2008 | Oman | H01L 23/3128 257/712 |
| 2009/0034327 A1* | 2/2009 | Yun | G11C 5/04 365/174 |
| 2009/0072384 A1* | 3/2009 | Wong | H01L 23/3677 257/712 |
| 2009/0129028 A1* | 5/2009 | Son | H01L 23/3107 361/715 |
| 2009/0168360 A1* | 7/2009 | Negrut | H01L 23/4006 361/710 |
| 2009/0295384 A1 | 12/2009 | Teppan | |
| 2009/0302445 A1* | 12/2009 | Pagaila | H01L 23/3121 257/678 |
| 2010/0008050 A1* | 1/2010 | Lee | H05K 7/20963 361/719 |
| 2010/0065950 A1 | 3/2010 | Lowry et al. | |
| 2011/0059580 A1* | 3/2011 | Jeon | H01L 23/3675 438/122 |
| 2011/0194253 A1* | 8/2011 | Momose | H01L 23/467 361/697 |
| 2011/0216507 A1* | 9/2011 | Kadomoto | H05K 7/20 361/714 |
| 2011/0255246 A1* | 10/2011 | Eisele | H01L 23/49568 361/706 |
| 2011/0317369 A1* | 12/2011 | Pautsch | H01L 23/473 361/702 |
| 2012/0020026 A1* | 1/2012 | Oganesian | H01L 23/5389 361/707 |
| 2012/0113598 A1* | 5/2012 | Toh | H01L 23/4006 361/715 |
| 2012/0218714 A1* | 8/2012 | Robert | H01L 23/053 361/713 |
| 2012/0262883 A1* | 10/2012 | Iwata | H01L 23/473 361/709 |
| 2013/0010429 A1* | 1/2013 | Tonomura | H01L 23/3735 361/720 |
| 2013/0067743 A1 | 3/2013 | Golick et al. | |
| 2013/0094122 A1* | 4/2013 | Domes | H05K 7/1432 361/321.1 |
| 2014/0131886 A1* | 5/2014 | Paek | H01L 24/11 257/774 |
| 2014/0217610 A1* | 8/2014 | Jeng | H01L 23/3128 257/774 |
| 2014/0239434 A1* | 8/2014 | Kim | H01L 25/105 257/467 |
| 2014/0313673 A1* | 10/2014 | Akamatsu | H05K 7/2039 361/706 |
| 2014/0357021 A1* | 12/2014 | Haba | H01L 25/0652 438/109 |
| 2014/0362537 A1* | 12/2014 | Yoon | H05K 7/209 361/716 |

OTHER PUBLICATIONS

The International Search Report and the Written Opinion of the International Searching Authority issued in counterpart application No. PCT/US2016/17500, dated Apr. 21, 2016 (9 pages).

The International Search Report and the Written Opinion of the International Searching Authority issued in counterpart application No. PCT/US2016/17503, dated Apr. 21, 2016 (9 pages).

\* cited by examiner

ELECTRONIC ASSEMBLY WITH ONE OR MORE HEAT SINKS

This document claims priority based on U.S. provisional application Ser. No. 62/115,719, filed on Feb. 13, 2015 and entitled ELECTRONIC ASSEMBLY WITH ONE OR MORE HEAT SINKS, under 35 U.S.C. 119(e).

FIELD OF DISCLOSURE

This disclosure relates to an electronic assembly with one or more heat sinks for dissipating thermal energy from the electronics assembly.

BACKGROUND

In certain prior art, an electronic assembly may have a restricted maximum operating power capacity because of limited thermal dissipation. If semiconductor devices in the electronic assembly are operated beyond their maximum operating power capacity, the electronic assembly may fail prematurely or be unreliable. For example, an electronics assembly with limited thermal dissipation might be applicable to a lesser power range of electric motors or generators than otherwise possible. Accordingly, there is need for an electronic assembly with improved thermal dissipation to increase or optimize the maximum operating power capacity.

SUMMARY

In accordance with one embodiment of the disclosure, an electronic assembly comprises a semiconductor device that has conductive pads on a semiconductor first side and a metallic region on a semiconductor second side opposite the first side. A lead frame provides respective separate terminals that are electrically and mechanically connected (e.g., directly bonded) to corresponding conductive pads. A first heat sink comprises a first component having a mating side (e.g., substantially planar side). A portion of the mating side is directly bonded with the metallic region of the semiconductor device. A circuit board has an opening for receiving the semiconductor device. The lead frame extends outward toward the circuit board or a board first side of the circuit board. Board conductive pads are on the board first side of the circuit board to align with the corresponding terminals of the lead frame for electrical connection therewith.

BRIEF DESCRIPTION OF THE DRAWINGS

Like reference numbers indicate like elements throughout the drawings.

BRIEF DESCRIPTION

Figure 1:
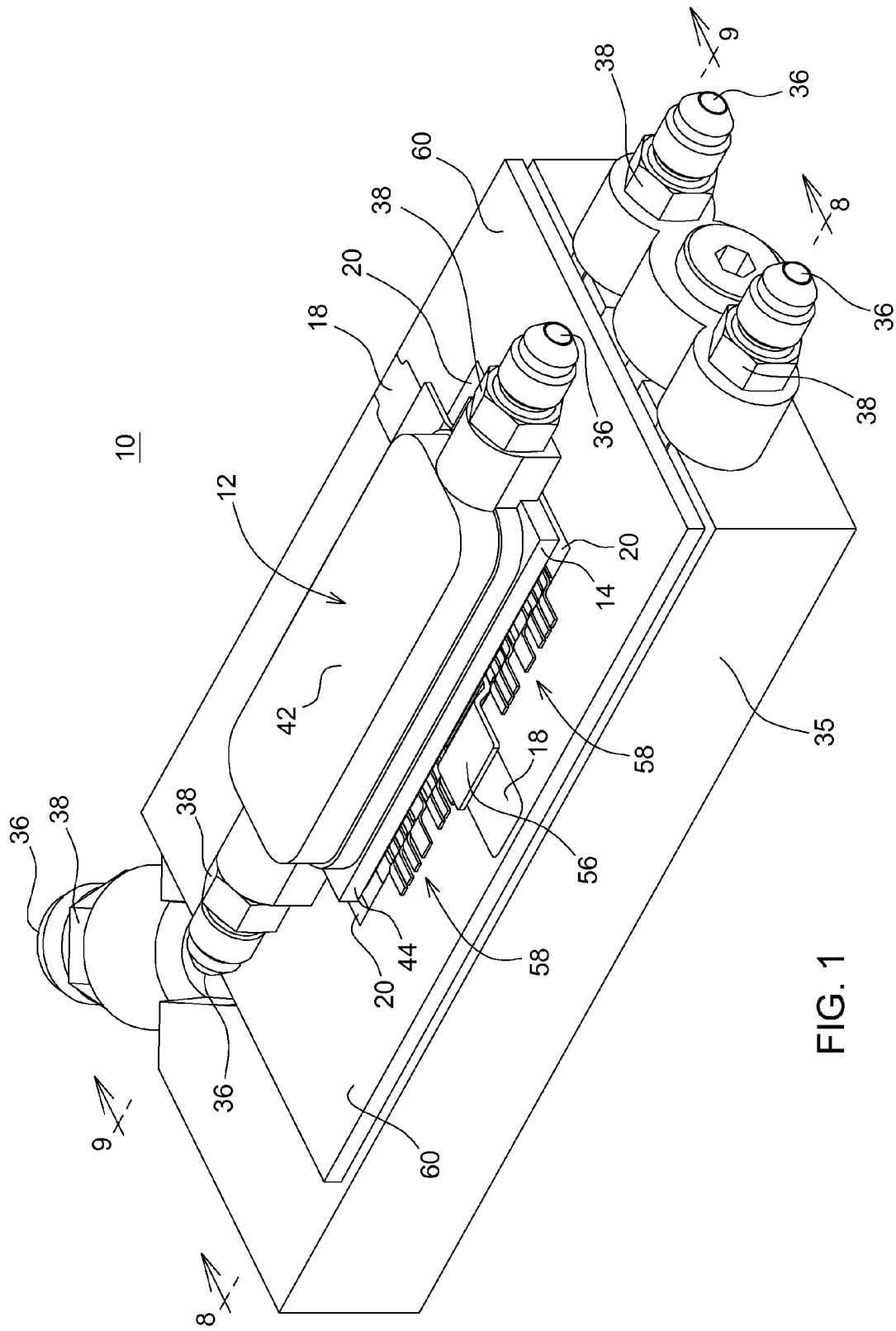
FIG. 1 is a perspective view of an electronic assembly.

An electrical and mechanical connection between metal or alloy components or structures may be formed by soldering, brazing, fusing, welding, or applying conductive adhesive. Directly bonded refers to an electrical and mechanical connection, between the same or similar metals or alloys, or between compatible (but different) metals or alloys, that is formed by application of certain processes. Directly bonded refers to a bond, fusion, weld, or other electrical and mechanical connection between the same or similar metals or alloys, or between compatible metals or alloys from heat, pressure, ultrasound, reactive bonding, vapor-phase bonding, or other techniques.

Direct bonding may be accomplished by one or more of the following techniques that may be applied cumulatively or separately. Under a first technique of direct bonding, if the lead frame and the device pads are composed of copper or a copper alloy, the lead frame may be directly bonded to the device pads by direct copper-to-copper thermo-compression bonding or ultrasonic bonding. Thermo-compression bonding refers to the simultaneous application of pressure and heat to the materials to be joined.

Under a second technique of direct bonding, reactive bonding refers to an exothermic chemical reaction triggered by application of thermal energy from a reactive multilayer foil (e.g., of nickel and aluminum) to join the materials by creation of a new metallic material or alloy (e.g., nickel-aluminide). For example, the multilayer foil may be formed by sputtering thin alternating metal layers (e.g., nickel layers and aluminum layers), where each layer may be deposited to a thickness equal to or less than target thickness. At the time of preparing this document, suitable reactive multilayer foils (e.g., for direct bonding of a heat sink to a metallic region) were sold by the Indium Corporation under the trade name NanoFoil®.

Under a third technique of direct bonding, vapor-phase bonding methods may be used to bond a metal or alloy (e.g., copper) to silicon semiconductors using a vapor-deposition of a priming intermediate metal layer (e.g., tin) to form an intermetallic compound (e.g., copper-tin compound or alloy) at the joint, where the intermetallic compound may have lower thermal electrical and thermal resistance than a comparable solder joint. The vapor-phase bonding may require introducing an intermediate metallic material (e.g., tin) between the metal materials to be joined with application of heat or pressure, or both. The intermediate metallic material may have a lower melting point than metals or alloys to be electrically and mechanically connected.

For efficient thermal conduction, adjoining parts of the electronic assembly are joined to minimize thermal resistance and maximize heat transfer or thermal conductance between the adjoining parts. Thermal conductance may be enhanced by the manner in which parts of the electronic assembly 10 are connected or bonded. Direct bonding typically offers greater thermal conduction than a mere connection by soldering, conductive adhesive, or by contact between components with conductive grease. In general, "bonded" or "bonding" refers to parts of the electronic assembly 10 that are connected together or joined by adhesive (e.g., conductive adhesive or thermally conductive adhesive), soldered, brazed, or welded, whereas "direct bonding" results from the application of specific processes or techniques that reduce electrical and thermal resistance of the joint.

Figure 2:
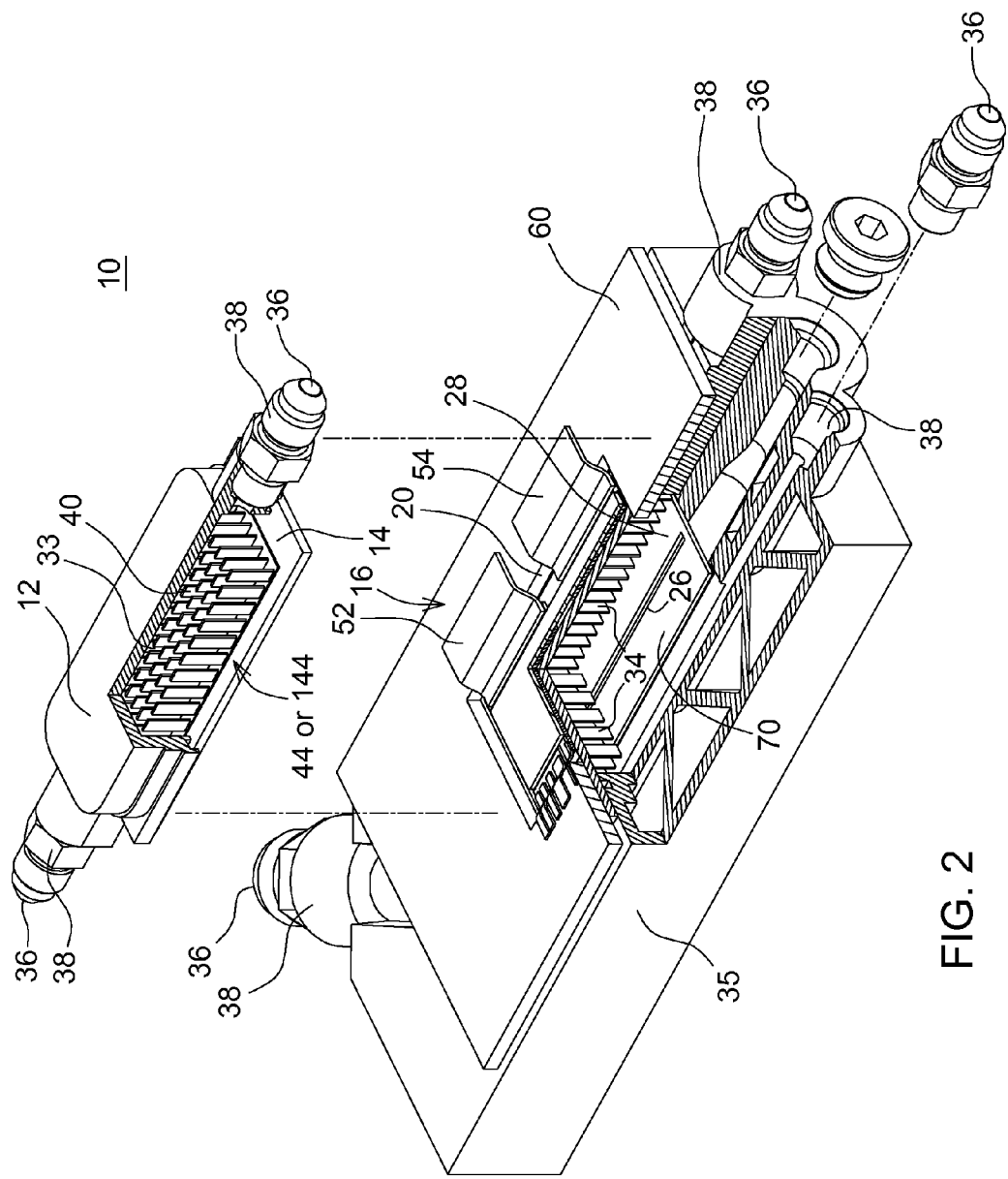
FIG. 2 is a perspective exploded view of the electronic assembly of FIG. 1 with a portion cut away to reveal the interior of various components.
Figure 3:
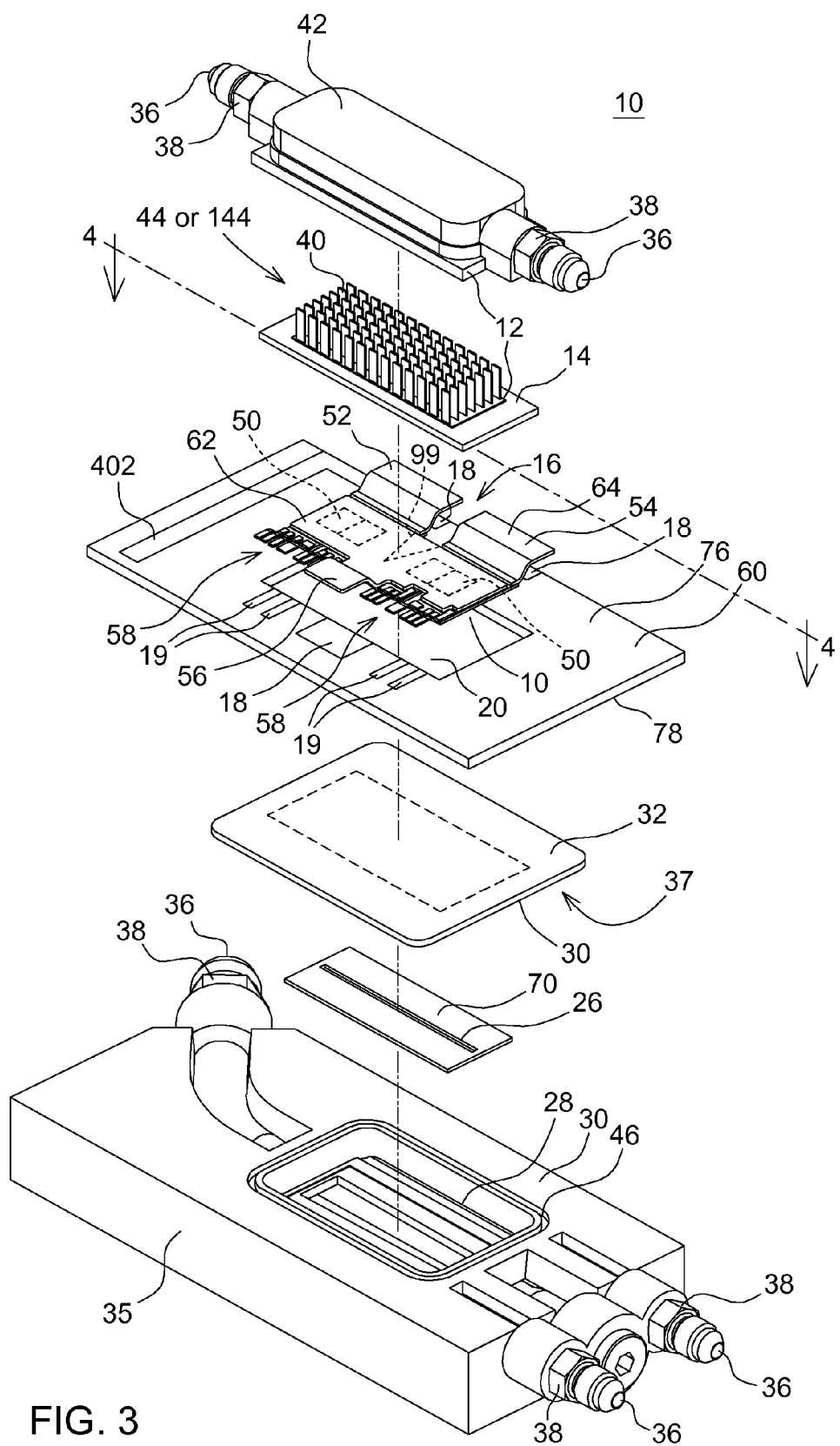
FIG. 3 is a perspective exploded view of the electronic assembly of FIG. 1.

In accordance with one embodiment of the disclosure, FIG. 1 through FIG. 3, inclusive, illustrate an electronic assembly 10. In accordance with one embodiment of the disclosure, an electronic assembly 10 comprises a semiconductor device 48 (FIG. 3, FIG. 4 and FIG. 5) that has conductive pads 66 on a semiconductor first side 72 and a metallic region 266 on a semiconductor second side 74 opposite the first side 72. The semiconductor device 48 may comprise one or more power semiconductor devices. A lead frame 16 provides separate terminals (e.g., supplemental terminals 58, and terminals 52, 54, 56) that are electrically and mechanically connected (e.g., directly bonded) to corresponding conductive pads 66.

A first heat sink 30 comprises a first component 37 (e.g., heat exchanger or passive heat sink) having a mating side 62 (e.g., substantially planar side) and an opposite side opposite the mating side 62. A portion of the mating side 62 is directly bonded with the metallic region 266 of the semiconductor device 48. A circuit board 60 (in FIG. 3 or FIG. 4) has an opening 20 for receiving the semiconductor device (48 or 148 in FIG. 7). The lead frame 16 extends outward toward the circuit board 60 or a board first side 76 of the circuit board 60. A board second side 78 of the circuit board 60 is opposite the board first side 78. Board conductive pads 18 or metallic terminations of conductive traces 19 are on the board first side 76 of the circuit board 60 to align with the corresponding terminals (52, 54, 56, 58) of the lead frame 16 for electrical connection therewith. In one illustrative configuration, the lead frame may be constructed of copper base or core that is plated with a metal or alloy interface layer (e.g., silver, gold or nickel, or alloys of any of the foregoing metals).

A second heat sink 12 comprises a first member (44 or 144) having a mating side 64 (e.g., substantially planar side) and an opposite side opposite from the mating side 64. In certain embodiments, the mating side 64 is in thermal communication (e.g., via a dielectric layer or thermal interface material 506) with at least a portion of the semiconductor first side 72 or at least an interfacing surface of the terminals (52, 54, 56), where the conductive pads (54, 56) may be directly bonded to corresponding different ones of the device conductive pads 66. Further, in one embodiment, both the auxiliary metallic region 166 and one or more device conductive pads 66 associated with an alternating current output of a semiconductor device 48 are bonded (e.g., soldered) or directly bonded to output terminal 56. The conductive pads 66 and auxiliary metallic regions (266, 366) are show in phantom or dashed lines in FIG. 4 because they are located below the terminals (52, 54, 56).

Figure 4:
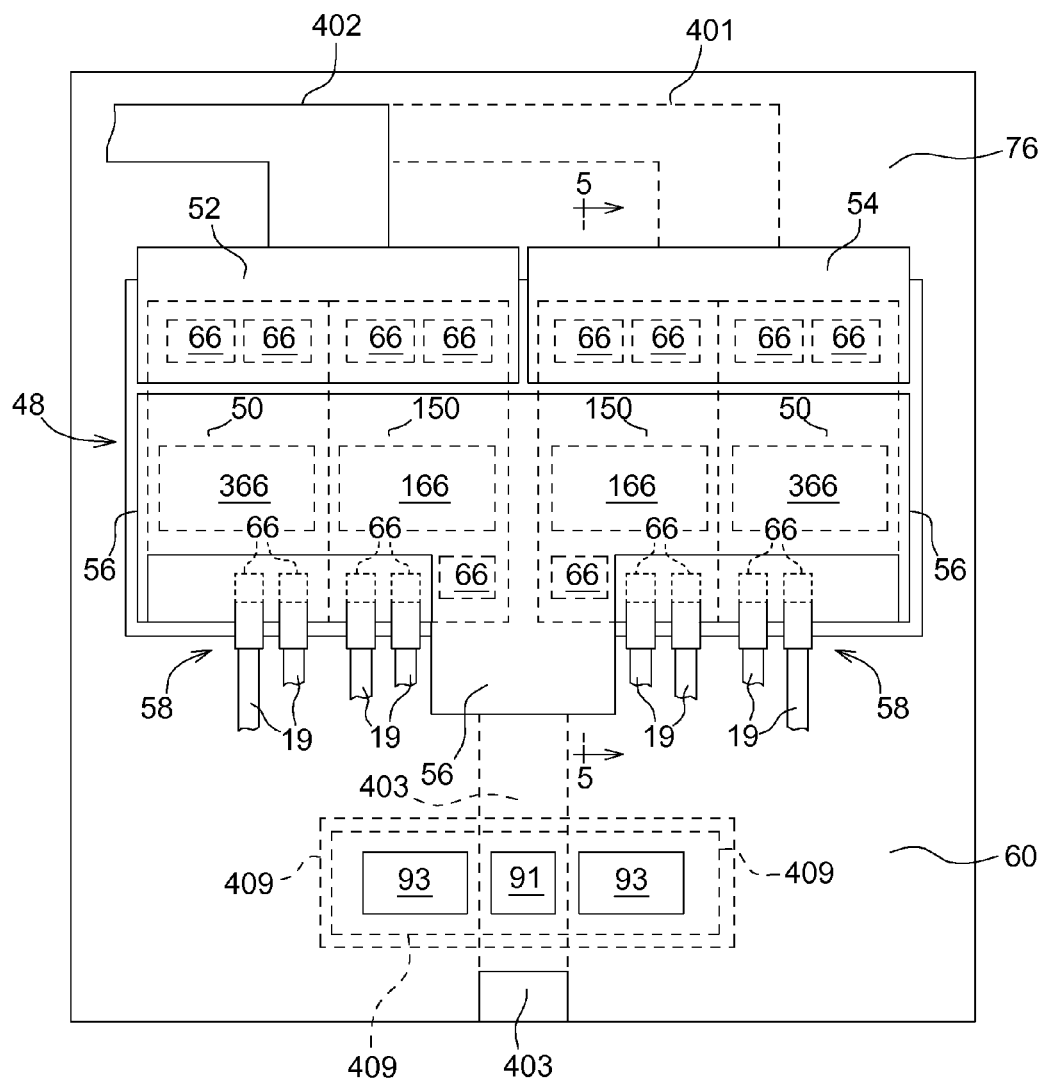
FIG. 4 is top plan view of the semiconductor device and circuit board of the electronic assembly along reference line 4-4 in FIG. 3.

The lead frame 16 may be directly bonded to the device pads 66 and one or more available auxiliary metallic regions (166, 366, if present) of the semiconductor device 48. If the internal circuitry of the semiconductor device 44 affords the opportunity, multiple respective device pads 66 can be interconnected to a same corresponding terminal (52, 54, 56) to increase the current capacity of the semiconductor device 48 as illustrated in FIG. 4. For example, in FIG. 4 among the terminals the output terminal 56 is connected to an output phase of an inverter and is directly bonded to at least two conductive pads 66 an auxiliary metallic region 166 on the semiconductor first side 72, and auxiliary metallic region 366, where the output terminal 56 has a surface area that covers or overlies a majority of the first side 72 of the semiconductor device 48 where the output terminal 56 has a greater surface area than a lesser aggregate surface area of the direct current terminals (52, 54).

In various embodiments, as best illustrated in FIG. 4 through FIG. 7, inclusive, the electronic assembly 10 comprises one or more semiconductor devices (48, 148) Each semiconductor device (48, 148) may comprise one or more insulated-gate, bipolar transistors (IGBT's); power field-effect transistors (FET); power switching diodes, integrated circuits chips, transistors with diodes coupled to the collector, emitter or both; or field effect transistors with diodes coupled to the source, drain or both. For example, the semiconductor device 48 may comprise at least two power switching transistors, alone or with associated protective diodes, that are configured to provide one phase of an inverter for outputting an alternating current signal or pulse width modulated (PWM) signal for controlling a motor, supporting a generator, or supporting another electric machine.

Each semiconductor device (48, 148) may comprise one or more semiconductor dies (50, 150) and a lead frame 16 (or substrate 505), where the semiconductor dies are semiconductor materials that are fabricated to form one or more transistors, diodes or circuits. The semiconductor device 48 may be formed of a semiconductor die (50, 150) such as a silicon carbide semiconductor die. The lead frame 16 provides separate terminals (52, 54, 56, 58) that are electrically and mechanically distinct from each other. The terminals are connected to appropriate corresponding device conductive pads 66 on the semiconductor device 48 to access its internal circuitry. The lead frame 16 provides a group of separate direct current terminals (52, 54) for direct current supply to the semiconductor devices (48, 148) and an output terminal (56) for an alternating current output. In one embodiment, the first terminal 52 and the second terminal 54 comprise terminals of the direct current bus and the third terminal 56 comprises an alternating current output phase (e.g., coupled to the source and drain node of field effect transistor pairs of an inverter phase circuit or the collector and emitter of bipolar transistor pairs of an inverter phase circuit) for an inverter. However, in other embodiments, the functions of the terminals (52, 54, 56) can be different.

Figure 5:
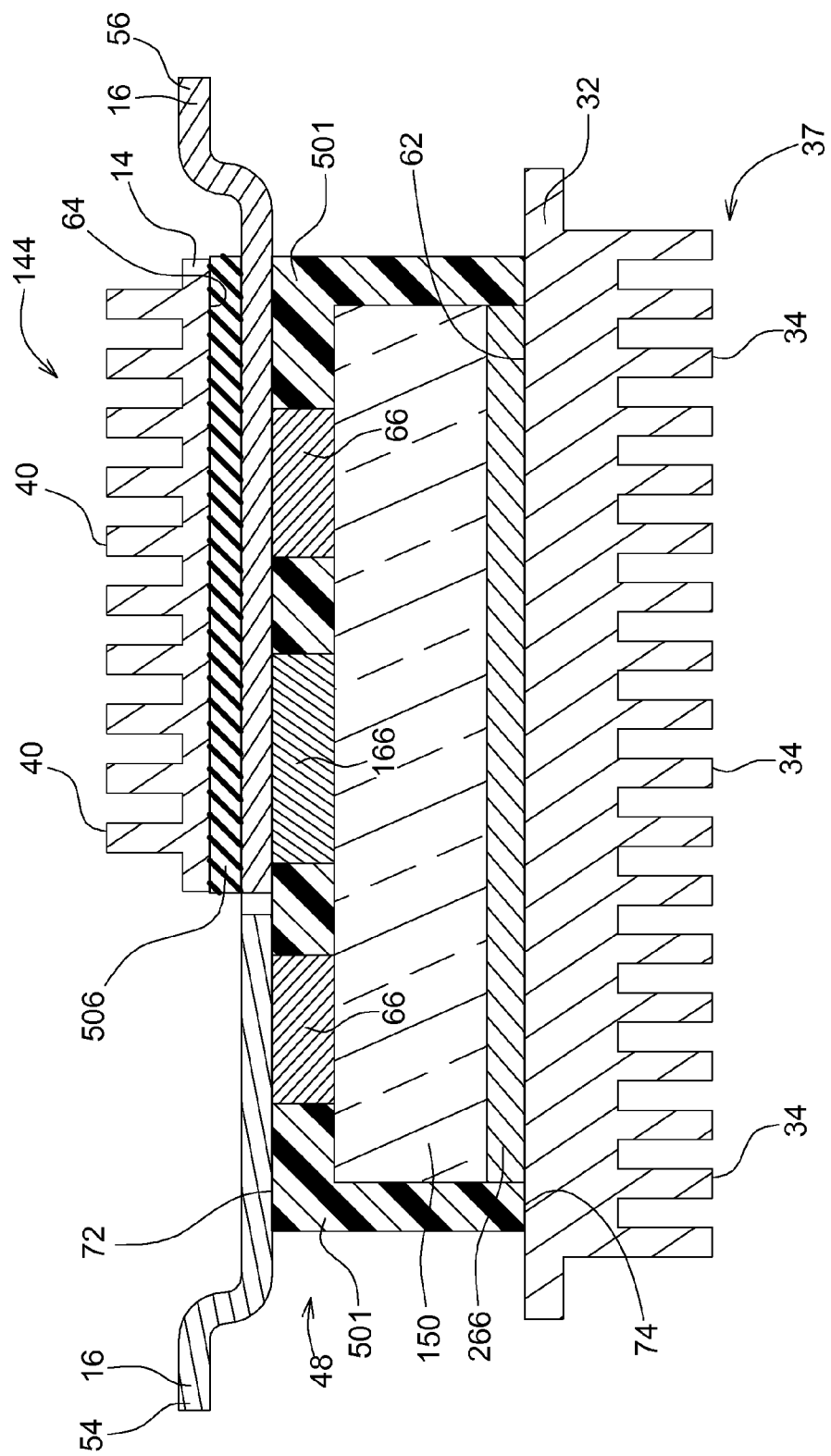
FIG. 5 is cross sectional view of a first embodiment of the electronic assembly along reference line 5-5 in FIG. 4 and further including passive heat sinks.

In one configuration as shown in FIG. 4 and FIG. 5, the output terminal or third terminal 56 may be mechanically and electrically connected to (e.g., directly bonded to) one or more auxiliary metallic regions (166, 366), where each auxiliary metallic region (166, 366) represents an oversized conductive pad (in comparison to conductive pads 66) on the semiconductor die (50, 150) or package. Similarly, the first terminal 52 and the second terminal 54 may be mechanically and electrically connected to (e.g., directly bonded to) other corresponding metallic regions or oversized conductive pads (in comparison to conductive pads 66).

In one embodiment, the lead frame 16 has supplemental terminals 58 for one or more of the following signals: control, biasing circuitry, protection circuits (e.g., diodes), sensor support, data communications, or other functions.

The supplemental terminals 58 of the lead frame 16 extend outward from the package 501 of the semiconductor device 48; the supplemental terminals 58 may be connected to corresponding device conductive pads 66 (in FIG. 4). As shown in FIG. 4, the semiconductor device 48 has device pads 66 around a periphery of the semiconductor device 48 and one or more metallic regions (166, 366) only occupy a central region of the semiconductor device 48.

One or more lead frames 16 can eliminate requirements for wire-bonds to the semiconductor die (50, 150); can provide optimized parameters for electrical characteristics such as minimized values of stray inductance and stray capacitance offered by circuitry (e.g., of a phase of the power inverter). Elimination of bond-wires and replacing them with the lead frame 16 can reduce overall cost of the semiconductor device 48 of the electronic assembly 10 and can reduce premature failures caused by wire-bond fatigue, for example.

In an alternate embodiment, the terminal 56 may have an optional notch 99 in its interfacing surface to provide stress relief (e.g., for differences in thermal expansion of various materials) or to provide access for insertion of potting material (e.g., polymer, elastomer or plastic). The optional nature of optional notch 99 is indicated by the dashed lines in FIG. 3. The optional notch 99 may be generally V-shaped or U-shaped, for example. In one embodiment, the notch 99 provides savings of metallic material and amply supports the output current that flow outwards to an outer portion of the third conductive terminal 56 (e.g., alternating current terminal) that is connected to conductive pad 18. Regardless of whether the optional notch 99 is present or absent, electrical current doesn't need to flow or concentrate in the triangular region defined by the notch 99 to supply an outer portion of terminal 56 with adequate current. Therefore, if the metallic material is taken out (or chopped out) to create optional notch 99, the notch 99 doesn't disrupt or impede current flow in the electronic device or inverter.

In one embodiment, the presence of notch 99 helps mitigate any coefficient-of-thermal-expansion (CTE) mismatch between one or more primary semiconductor dies (50,150) on left-side of FIG. 4 and one or more secondary semiconductor dies on the right-side of FIG. 4, where the primary semiconductor dies or secondary semiconductor dies are active at different times and may have different duty cycles. Either the primary semiconductor dies (e.g., low-side semiconductor switches) or the secondary semiconductor dies (e.g., high-side semiconductor switches) supply current (e.g., alternating current inverter phase output signal) to the outer portion of terminal 56 and the conductive pad 18. Typically, the primary semiconductor dies and the secondary semiconductor dies do not provide current to terminal 18 simultaneously. Therefore, if a primary semiconductor die or dies heats the left-side of the electronics device 10 because of a greater duty cycle, activity or other reasons, the right-side semiconductor die or dies may be closer to internal ambient temperature, or vice versa. During operation of the electronic assembly or inverter, a differential temperature between the primary semiconductor dies and secondary semiconductor dies that could otherwise lead to CTE-related issues are mitigated by the presence of notch 99.

FIG. 4 is top plan view of the semiconductor device 48 and circuit board 60 of the electronic assembly 10 along reference line 4-4 in FIG. 3. In FIG. 3 and FIG. 4, first conductive strip 402 on a board first side 76 of the board 60 is connected to the first terminal 52 at conductive pad 18 and has a sufficient size (e.g., width and thickness of metal, alloy or metallic material, such as a heavy copper pour) to carry the required direct current supply demanded by each semiconductor device 48 at the corresponding operating voltage and to promote secondary heat dissipation from the first terminal 52. The second conductive strip 401 on a board second side 78 of the board 60 is connected to the second terminal 54 at conductive pad 18 (e.g., through a conductive via or blind via) and has a sufficient size (e.g., width and thickness of metal, alloy or metallic material) to carry the required direct current supply demanded by each semiconductor device 48 at the corresponding operating voltage and to promote secondary heat dissipation from the second terminal 54. A third conductive strip 403 lies on the board second side 78 and is connected to the third terminal 56 at conductive pad 18 (e.g., through one or more conductive vias or blind vias). In one embodiment, the third conductive strip 402 has a sufficient size (e.g., width and thickness of metal, alloy or metallic material) to carry the required alternating current output or pulse-width modulation signal (e.g., to control one phase of an electric motor) and to promote secondary heat dissipation from the third terminal 56.

The first conductive strip 402 on a board first side 76 of the board 60 and the second conductive strip 401 on a board second side 78 of the board 60 overlap spatially (but separated by the dielectric layer of the board) to minimize loop inductance. Minimization of loop inductance caused by power traces on board 60 allows power semiconductor devices (48, 148) to switch faster and reduce energy loss to due reduction in switching time. Reduction in energy loss helps increase inverter efficiency and results in fuel savings for hybrid vehicles that use fuel for an internal combustion engine. Reduction in loop inductance tends to reduce over-voltage across DC terminals (52 and 58) and at output AC terminal (56), which can increase life of power semiconductor devices (48) and longevity of insulation system of electric motor drive by inverter or electronic assembly 10. Therefore, the proposed packaging concept results in an electronic assembly 10 or inverter system that offers energy/fuel savings and increased reliability of the electric drive system because of potential or actual reductions in the electrical stress, thermal stress, or both.

In one alternate embodiment, the first conductive strip 402, the second conductive strip 401 and the third conductive strip 403 may be thermally connected the first heat sink 30, the second heat sink 12, or an outer enclosure or cover of the electronic assembly by using high-voltage dielectric and high-thermal conductivity TIM (thermal interface material).

A current sensor 91 is located on the board first side 76 above the third conductive strip 403 to sense the alternating output current carried by the conductive strip 403 or outputted by the semiconductor device 48 (e.g., for a single inverter phase at output terminal 56). The current sensor 91 may be associated with ferrite members 93 on each side of the current sensor 91. The current sensor 91 and the ferrite members 93 are surrounded by a metallic shield 409 to shield the current sensor 91 from electromagnetic interference or noise that might otherwise degrade the sensitivity or performance of the current sensor 91. The metallic shield 409 may conform to the size and shape of the current sensor 91, alone or together with the ferrite members 93, above circuit board 60 with a generally uniform spatial gap between the metallic shield 409 and the current sensor 91 for mechanical clearance. For example, the metallic shield 409 may conform to the size and shape of the current sensor 91, alone or in combination with ferrite member 93, that is substantially polygonal with an opening in its bottom above strip 403. The metallic shield may be formed of one or more sections of metal screen, metallic material, or fabricated sheet metal. In one configuration, the metallic shield 409 may be integral with, secured to, or molded with an housing member of an enclosure cover that covers at least a top portion of the electronic assembly.

The current sensor 91 and shield 409, which can be incorporated integrally into an upper case or housing cover, is capable of shielding a surface-mount current sensor 91 to sense alternating current power output at output terminal 56. The shielding eliminates noise and interaction among sensors for different phases making inverter operation free from noise that occurs when non-core (magnetic core) based sensors are placed over alternating current strip or bus bar.

In an alternate embodiment, the first conductive strip 402, the second conductive strip 401, and the third conductive strip 403 can be replaced by metal bus bars or laminated metal members (e.g., metal bus bars) with an intermediate dielectric layer.

FIG. 5 is cross sectional view of a first embodiment of the electronic assembly along reference line 5-5 in FIG. 4 and further including passive heat sinks (144, 37) or heat exchangers. In FIG. 5 and FIG. 6, the first member 144 (e.g., heat exchanger or passive heat sink) of the second heat sink 12 is electrically isolated from the lead frame 16 by a thermal interface material 506, a dielectric layer, or a dielectric adhesive. In some configurations, the second heat sink 12 may be connected to vehicle or chassis ground. A thermal interface material 506 (TIM) sheet or layer is placed between top surface of lead frame 16 and second heat sink 12. In one embodiment, the TIM layer 506 is composed of a dielectric material or sheet that is adhesively bonded to the lead frame 16, the second heat sink 12 or both. The first member 144 of the second heat sink 12 is electrically isolated or insulated from one or more terminals (52, 54 and 56, or at least terminal 56) by the thermal interface material 506.

In the first heat sink 30, first protrusions 34 extend from the first base portion 32, such as a metallic plate. In the second heat sink 12, second protrusions 40 extent from the second base portion 14, such as metallic plate. The first protrusions 34 and the second protrusions 40 are arranged to dissipate thermal energy or heat from the semiconductor device 48 on both sides (72, 74) of the semiconductor device 48.

Figure 6A:
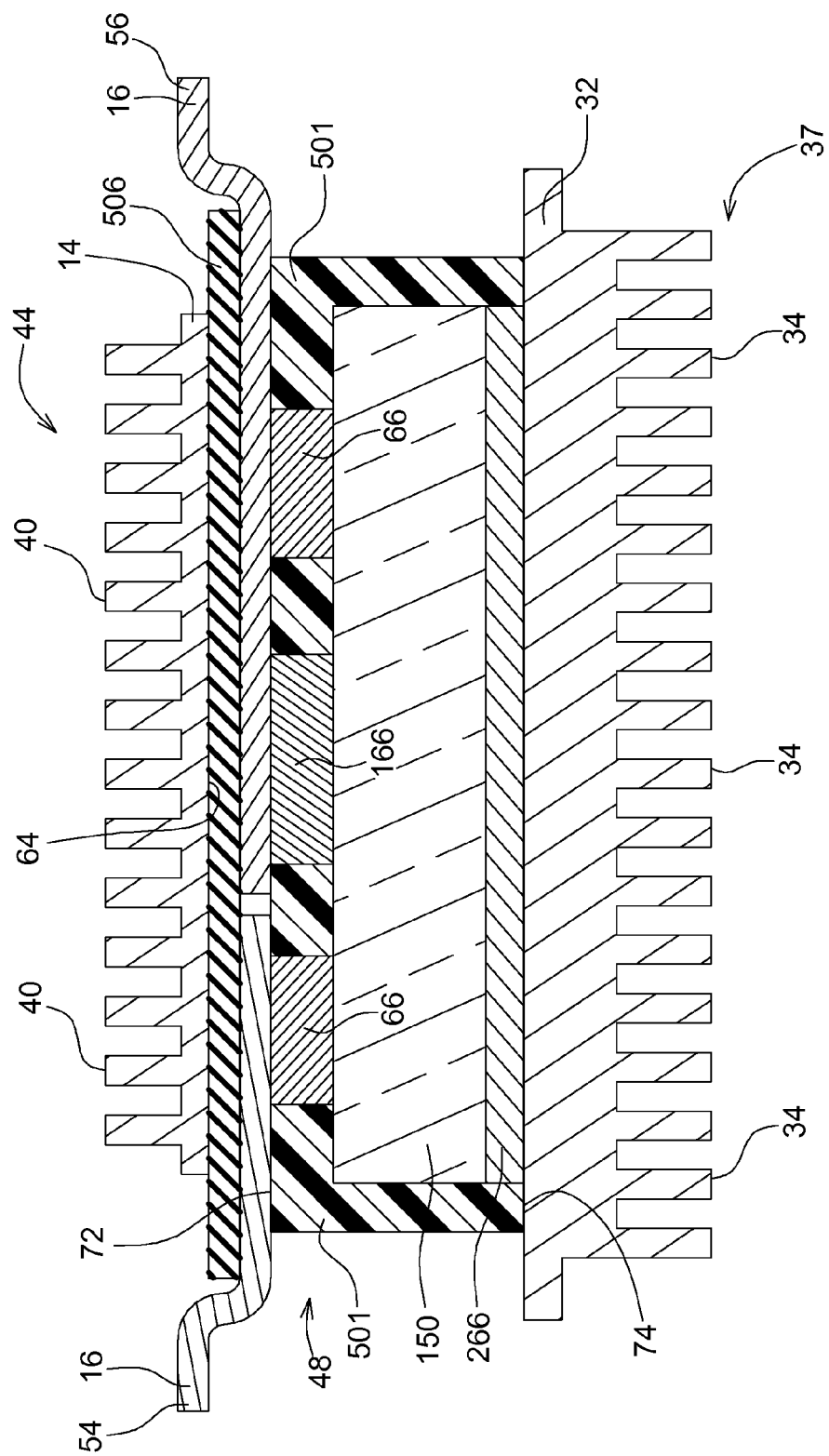
FIG. 6A is cross sectional view of a second embodiment of the electronic assembly along reference line 5-5 in FIG. 4 and further including passive heat sinks.
Figure 7:
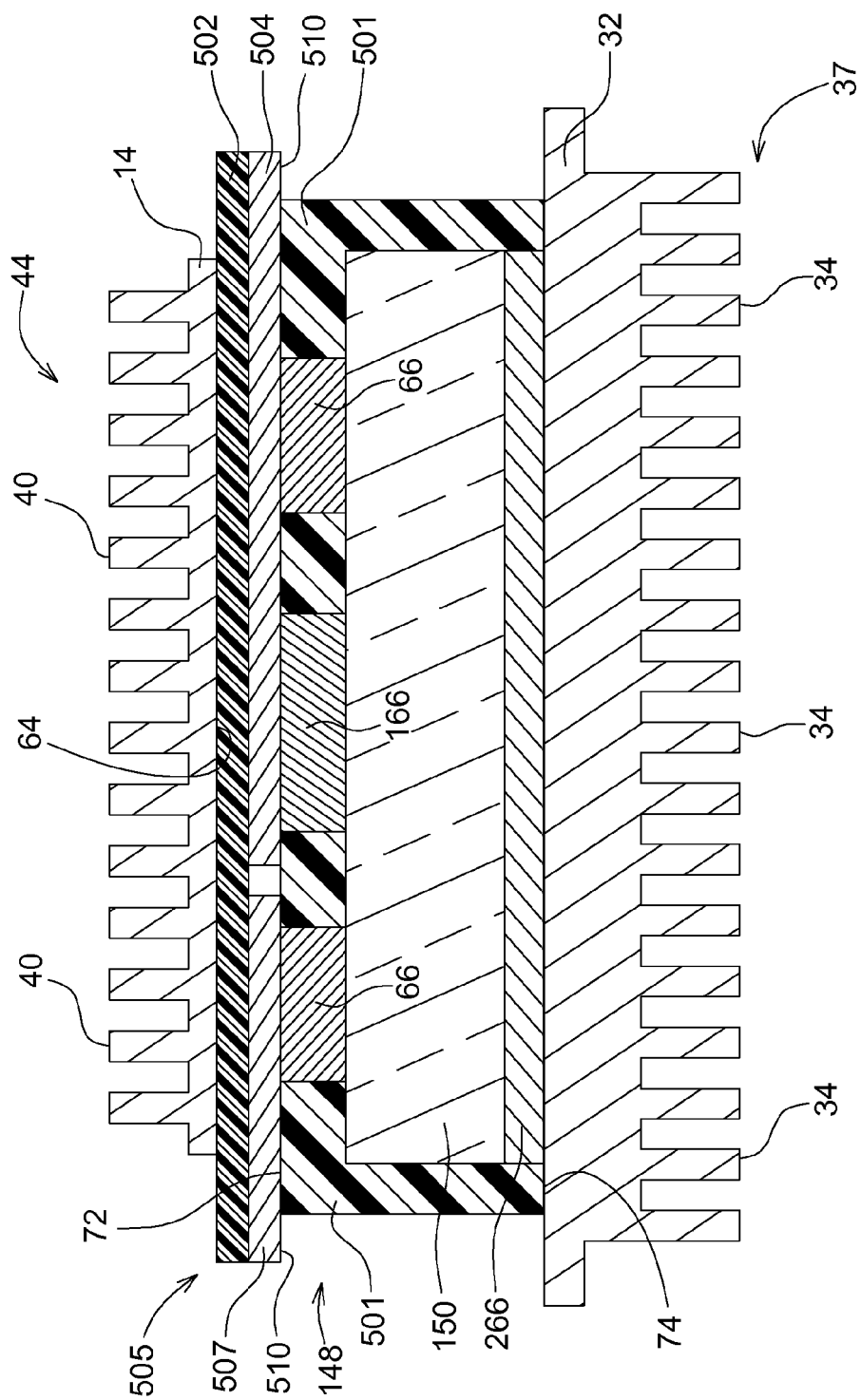
FIG. 7 is cross sectional view of a fourth embodiment of the electronic assembly along reference line 5-5 in FIG. 4 and further including passive heat sinks.

In FIG. 5, FIG. 6A and FIG. 7, the first component 37 (e.g., heat exchanger or passive heat sink) of the first heat sink 30 may be bonded or directly bonded to the a metallic region 266 on the device second side 74 (e.g., bonding surface or bottom surface) of the semiconductor device 48 or die (50, 150). For example, the direct bonding supports a low resistance to thermal conductivity from the semiconductor device 48 to the first component 37 or first heat sink 30. The metallic region 266 may be formed of copper, silver, gold, nickel or an alloy, for example. Alternately, the metallic region 266 may have a silver, gold or nickel layer that overlies a copper core. Similarly, the mating side 62 first component 37 and the mating side 64 of the first member (44 or 144) may be plated with silver, gold, nickel, or any alloy of the foregoing metals or a combination of the foregoing metals to facilitate bonding with the first component 37 and the first member (44 or 144).

The first component 37 or first heat sink 30 may be directly bonded to the metallic region 266 on the semiconductor device 48 by direct copper-to-copper, thermo-compressive bonding or ultrasonic bonding to bond a metallic layer 266 on the device second side 74 (e.g., bottom) of semiconductor package 501 to the first heat sink 30, or its first component 37, another suitable technique of direct bonding, such as reactive or vapor-phase bonding. The metallic region 266 (e.g., copper metallization region) on a device second side 74 (e.g., bottom) of semiconductor device 48 could be at ground or floating potential. The metallic region 266 can dissipate or transfer heat from the semiconductor device 48 to the first component 37 or the first heat sink 30. Similarly, the auxiliary metallic region 166 and pads 66 can dissipate or transfer heat from the semiconductor device 48 to the second member 42 of the second heat sink 12 or its first member 144. The presence of both auxiliary metallic region 166 and one or more pads 66 for any corresponding terminal provides potentially greater heat dissipation and current carrying capacity of the terminal than for a terminal of smaller size and dimensions.

In one embodiment, the first member (44, 144) is formed of a metallic material, an alloy or metal, for example. However, in certain embodiments, the first member 44 may be formed of a dielectric material, such as ceramic. In certain configurations, the second member 42 may be formed of plastic, polymer, or a fiber-filled plastic or polymer material.

FIG. 6A is cross sectional view of a second embodiment of the electronic assembly along reference line 5-5 in FIG. 4 and further including passive heat sinks. The electronic assembly of FIG. 6 is similar to the electronic assembly of FIG. 5, except first member 44 of FIG. 6A replaces first member 144 of FIG. 5 and TIM 506 has a greater size, shape and surface area commensurate with that of the first member 44. The first member 44 may overlie the terminals (52, 54, 56). In contrast, the first member 144 of FIG. 5 may be narrower in width and may only overlie the third terminal 56 (output terminal). The first member 44 of the second heat sink 12 is electrically isolated or insulated from terminals (52, 54 and 56) by the thermal interface material 506. In FIG. 6A, the first heat sink 30 is bonded or directly bonded to the metallic region 266.

Figure 6B:
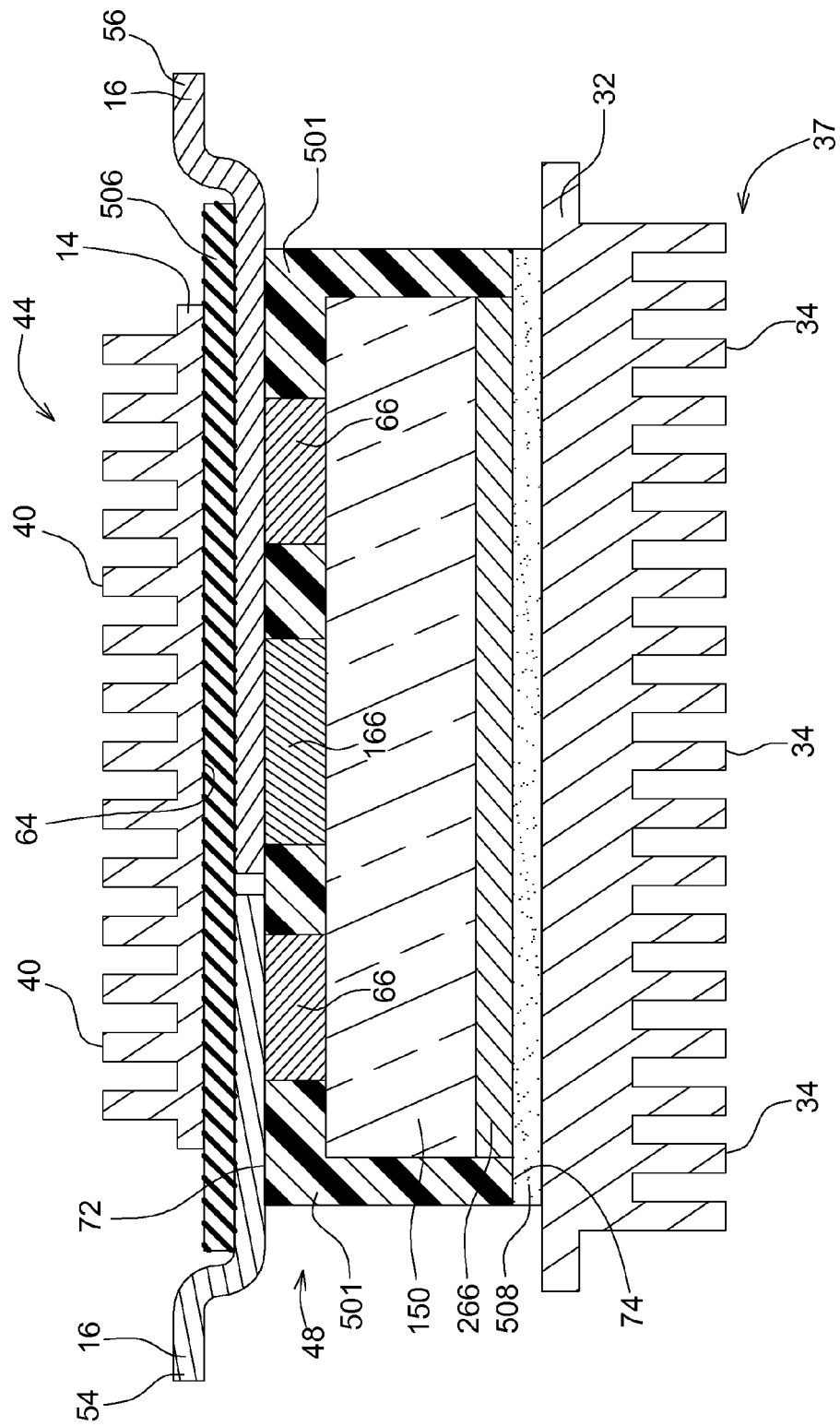
FIG. 6B is cross sectional view of a third embodiment of the electronic assembly along reference line 5-5 in FIG. 4 and further including passive heat sinks.

The configuration of FIG. 6B is similar to the configuration of FIG. 6A, except a thermally conductive adhesive 508 is used between the metallic region 266 (or the second surface 74) and the first component 37 of the first heat sink 30. The semiconductor device 48 and the first heat sink 30 may be directly bonded, bonded or connected by thermally conductive adhesive 508. If thermally conductive adhesive is used, it is possible to omit the metallic region on the bottom of the semiconductor device 48 of FIG. 6B and extend the package 501 around the bottom of the semiconductor device 48.

FIG. 7 is cross sectional view of a fourth embodiment of the electronic assembly along reference line 5-5 in FIG. 4 and further including passive heat sinks. The electronic assembly of FIG. 7 is similar to the electronic assembly of FIG. 5, except the thermal interface material 506 and the lead frame 16 are replaced by the substrate 505 with its conductive trace terminals (504, 507) and its dielectric layer 502 (e.g., ceramic, polymer or composite). The conductive traces (504, 507) of the substrate comprise an output terminal 504 that is analogous to output terminal 56 on the electronic assembly of FIG. 5. For example, the output terminal 504 may represent the alternating current output of one phase of the inverter. The output terminal 504, or its interfacing surface, is bonded (or directly bonded) to one or more conductive pads 66 of the semiconductor device 48 and an auxiliary metallic region 166 on the device first side 72; the mating surface 510 of the output terminal 504 is electrically and mechanically connected to one or more conductive pads 18 on the circuit board 60. Similarly, the terminal 507 is bonded (or directly bonded) to one or more conductive pads 66 of the semiconductor device 48; the mating surface 510 is electrically and mechanically connected to one or more conductive pads on the circuit board 60. The output terminal 504 is connected to a corresponding conductive strip 402 (e.g., on the circuit board 60), where the conductive strip 402 has sufficient size to promote secondary heat dissipation from the output terminal 504. In certain configurations, the output terminal 504 is connected to a corresponding metal strip (e.g., conductive strip 402) on the circuit board for heat transfer from the output terminal 504 to the metal strip.

As shown in FIG. 5 through FIG. 7, inclusive, the bottom, sides, or air gaps below the lead frame of the semiconductor device are encapsulated with plastic, polymer, resin, or plastic or polymer with a suitable filler material, which may be referred to as package 501. Encapsulation of the semiconductor device reduces assembly pollution, increases dimensional stability in response to thermal or mechanical stress, and avoids arcing or flash-over when the semiconductor device is operating at high operational voltage (e.g., 800 Volts plus nominal, plus transient voltage spikes). The semiconductor devices (48, 148) in FIG. 5 through FIG. 7 may be used in a passively cooled mode without forming or providing the coolant passages, chambers or interiors for circulating coolant within the complete electronic assemblies 10 of FIG. 1-3, FIG. 8 and FIG. 9.

The electronic assembly 10 (or its semiconductor device 48, 148) of this disclosure allows thermal energy to be conducted efficiently away from the semiconductor device 48 to the first heat sink 30 (or its first component 37), the second heat sink 12 (or its first member 44 or 144), or both through one or more thermal pathways of the electronic assembly. In a first example, a first thermal pathway represents a thermally conductive path from the die (50, 150) via a metallic region 266 that is bonded or directly bonded to the first heat sink 30. In a second example, the first thermal pathway represents a thermally conductive path from the die (50, 150) via a metallic region 266 (or package 501) that thermally communicates with the first heat sink 30 through a thermal interface material 506 or thermally conductive adhesive. In a third example, a second thermal pathway represents a thermally conductive path from the die (50, 150) via one or more device conductive pads 66 and one or more metallic regions (166, 366) to the output terminal 54 (oversized alternating current terminal) that: (a) is connected (e.g., bonded or directly bonded) to conductive traces (e.g., strip 403 or heavy copper pours) of appropriate size for current and power of the output alternating current, and (b) thermally communicates to the second heat sink 12 (or its first member 44, 144) via a thermal interface material 506 or dielectric layer. For example, the thermal interface material 506 may be selected to have a certain minimum thermal conductivity or a target range of thermal conductivity. In one embodiment, the first thermal pathway and the second thermal pathway promote adequate heat dissipation for the semiconductor device 48 to work at a target power capacity rating at a desired duty cycle or continuous duty cycle.

Referring to FIG. 1 through FIG. 3, FIG. 8 and FIG. 9, the electronic assembly 10 comprises a first heat sink 30, a second heat sink 12, or both. A passively cooled heat sink may transfer, remove or conduct heat or thermal energy away from one or more semiconductor devices 48 to ambient air. An actively cooled heat sink may use a coolant or liquid to transfer heat or thermal energy from one or more semiconductor devices 48 by circulating coolant via a pump (e.g., pump 243 in FIG. 10) to a radiator (e.g., radiator 246 in FIG. 10), or by circulating air via a fan, for example. In certain embodiments, as illustrated in FIG. 5 through FIG. 7, the first heat sink 30 or the second heat sink 12 can comprise a passively cooled heat sink (e.g., cold plate). However, if the first heat sink 30 is used in conjunction with additional components of FIG. 1 through FIG. 3, inclusive, and FIG. 8, FIG. 9 and FIG. 10, the first heat sink 30 may operate as an actively cooled heat sink. Similarly, if the second heat sink 12 is used in conjunction with additional components of FIG. 1 through FIG. 3, inclusive, and FIG. 8, FIG. 9 and FIG. 10, the second heat sink 12 may operate as an actively cooled heat sink. If operated as an active heat sink, the second heat sink 12 and the first heat sink 30 may each comprise an enclosure for receiving a liquid coolant.

Throughout this document, a heat sink may refer to one or more of the following: a first heat sink 30, the second heat sink 12; a portion of the first heat sink 30, such as the second component 35; and a portion of the second heat sink 12, such as the second member 42. The heat sink may comprise a passive or active: first heat sink, second heat sink, or both. A passive heat sink may be cooled by ambient air, whereas the active heat sink may be cooled by coolant that is circulated or circulated air, for example.

Figure 8:
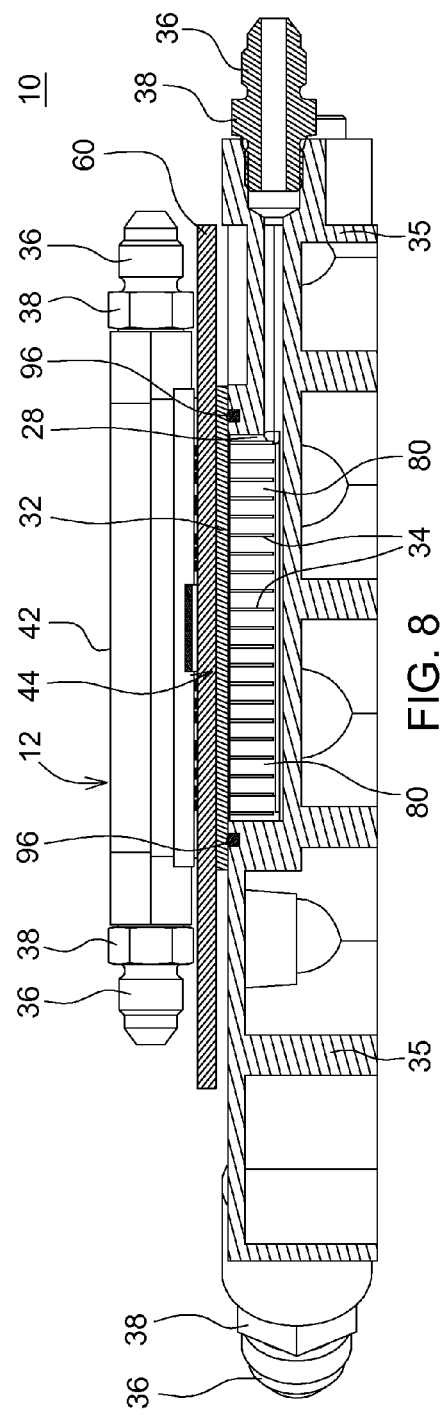
FIG. 8 is cross sectional view of the electronic assembly along reference line 8-8 in FIG. 1.
Figure 9:
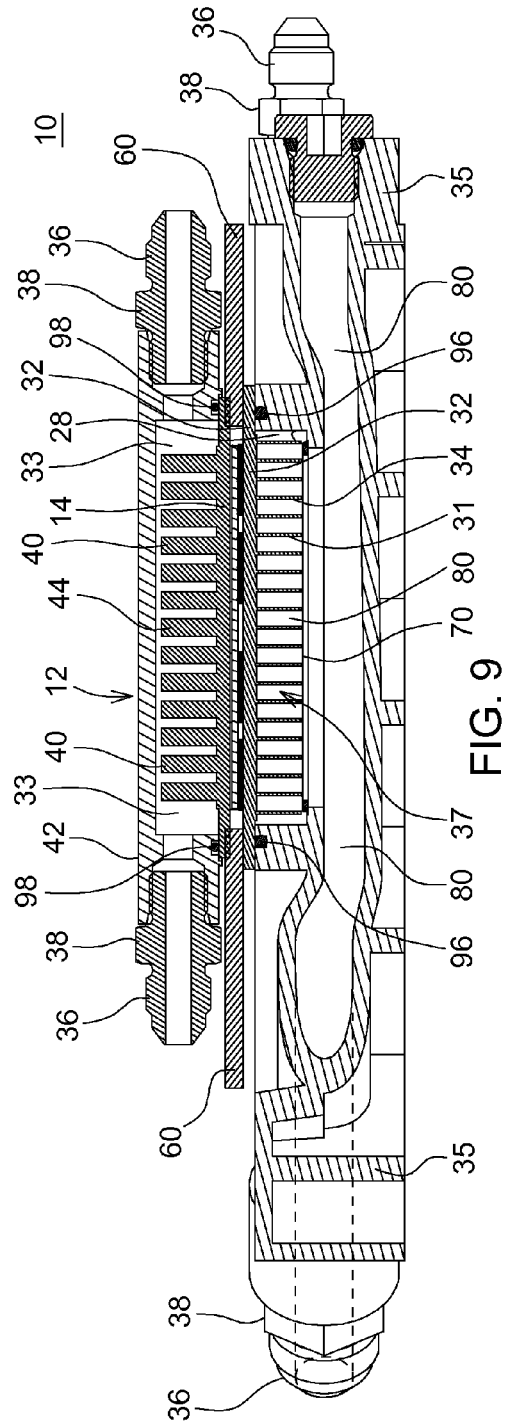
FIG. 9 is cross sectional view of the electronic assembly along reference line 9-9 in FIG. 1.

In one embodiment, first heat sink 30 comprises a first component 37 and a second component 35 with a recess 28. The first component 37 and the second component 35 mate to form an interior volume 80, which is defined partially by the recess 28. A seal 96 (e.g., gasket, sealant, or seal, such as illustrated in FIG. 8 and FIG. 9) may intervene between the first component 37 and the second component 35 to provide a hermetic or liquid-tight seal such that coolant or liquid in the interior chamber 33 does not leak or escape into an outside or ambient environment. In one embodiment, a plate 70 with a slot or aperture 26 may be disposed between the first component 37 and the second component to reduce the hydraulic pressure or forces that would otherwise be exerted (e.g., upward against the first component 35 from the coolant to prevent the first base 32 from deforming, bulging or bending). In certain configurations, the second component 35 may be formed of plastic, polymer, or a fiber-filled plastic or polymer material.

In one embodiment, the first component 37 of the first heat sink 30 comprises a lid or first base 32 with first protrusions 34 (e.g., thermal dissipation members) extending from one end. First protrusions 34 may refer to fins, ridges, pins, elevated islands, or protrusions for heat dissipation. First protrusions 34 comprise thermal dissipation members that can populate the interior volume 80 and that are generally spaced apart from each other. The first protrusions 34 extend from the first base portion 32, such as a metallic plate. In certain configurations, the base portion 32 may comprise a generally planar member of a generally uniform thickness. If coolant or liquid is circulated within the interior volume 80, the first protrusions 34 facilitate heat transfer from the semiconductor devices 48 to the circulated coolant for removal via a radiator (e.g., 246 in FIG. 10) or heat exchanger to ambient air or otherwise.

The first heat sink 30 features at least two ports 36: an inlet and an outlet for a first heat sink 30. The ports 36 are arranged for communication with the interior volume 80 to circulate a liquid coolant within the interior volume 80 of the first heat sink 30. Each port 36 may be associated with a corresponding connector 38 to allow conduit or tubes to be attached thereto for connection to a pump, radiator, or both to circulate the coolant within the interior volume 80 and to remove thermal energy from the coolant to ambient air via the radiator.

In one embodiment, the second heat sink 12 further comprises a second member 42 that mates with the first member 44 to form an interior chamber 33. For example, the second heat sink 12 may comprise a first member 44 (e.g., first housing member) that mates with a second member 42 (e.g., second housing member) to form the interior chamber 33. A seal 98 (e.g., gasket, sealant, or seal, such as that illustrated in FIG. 8 and FIG. 9) may intervene between the first member 44 and the second member 42 to provide a hermetic or liquid-tight seal such that coolant or liquid in the interior chamber 33 does not leak or escape into an outside or ambient environment.

One side of the first member 44 (e.g., heat sink or heat exchanger) comprises second protrusions 40 for heat dissipation. Second protrusions 40 may refer to fins, ridges, pins, elevated islands, or protrusions for heat dissipation. The first member 44 comprises the combination of the first base 14 and the second protrusions 40. The first member 44 can be used as a passive heat sink in the absence of the second member 42.

In one embodiment, in the second heat sink 12 second protrusions 40 or other thermal dissipation members populate the interior chamber 33 and are generally spaced apart from each other. The second protrusions 40 extend from a first base 14. In certain configurations, the first base 14 may comprise a generally planar member of a generally uniform thickness. If coolant or liquid is circulated within the interior chamber 33, the second protrusions 40 facilitate heat transfer from the semiconductor devices 48 to the circulated coolant for removal via a radiator (e.g., 246 in FIG. 10) or heat exchanger to ambient air or otherwise. The second heat sink 12 features at least two ports 36: an inlet and an outlet for a second heat sink 12.

The ports 36 of the second heat sink 12 are arranged for communication with the interior chamber 33 to circulate a liquid coolant within the interior chamber 33 of the second heat sink 12.

FIG. 8 is cross sectional view of the electronic assembly along reference line 8-8 in FIG. 1. FIG. 9 is cross sectional view of the electronic assembly along reference line 9-9 in FIG. 1. Like reference numbers in FIG. 8, FIG. 9 and FIG. 1 indicate like elements. FIG. 8 and FIG. 9 illustrate the electronic assembly 10 after it is assembled. In one configuration, the electronic assembly 10 may be assembled as follows.

First, a semiconductor devices 48 is directly bonded to one or more cold plates or heat exchangers, such as first component 32 or the first heat sink 30 to form a chip assembly.

Second, the second sink 12 (or its first member 44 or 144), or both through one or more thermal pathways of the electronic assembly. In a first example, a first thermal pathway represents a thermally conductive path from the die (50, 150) via a metallic region 266 that is directly bonded to the first heat sink 30 or that is bonded with a thermally conductive adhesive.

Third, the chip assembly can be placed through an appropriately sized opening 20 in the circuit board 60. A circuit board 60 has an opening 20 for receiving the semiconductor device 48. The lead frame 16 extends at or outward toward a board first side 76 of the circuit board 60. A board second side 78 of the circuit board 60 is opposite the first side 76. Board conductive pads (18, 19) are on the board first side 76 of the circuit board 60 to align with the corresponding terminals (52, 54, 56, 58) of the lead frame 16 for electrical connection and mechanical connection with the corresponding terminals. In certain fabrication techniques, the opening 20 in the circuit board 60 allows after-treatment of power circuit to meet creepage, clearance and high voltage insulation requirements between semiconductor devices 48 and cold-plate. Exposure of chip assembly via the opening 20 in the circuit board 60 can lower manufacturing cost or simplify manufacturing processes because the washing and cleaning processes, which are needed to eliminate residue left-over from lead-frame application, are easier, simpler; in some circumstances can be eliminated.

Fourth, the second component 35 is joined or secured to the first component 37 to form the first heat sink 30 with an interior volume 80 for pumped fluid to circulate.

Fifth, the second member 42 is joined or secured to the first member (44 or 144) to form the second heat sink 12 with an interior chamber 33 for pumped fluid to circulate.

Figure 10:
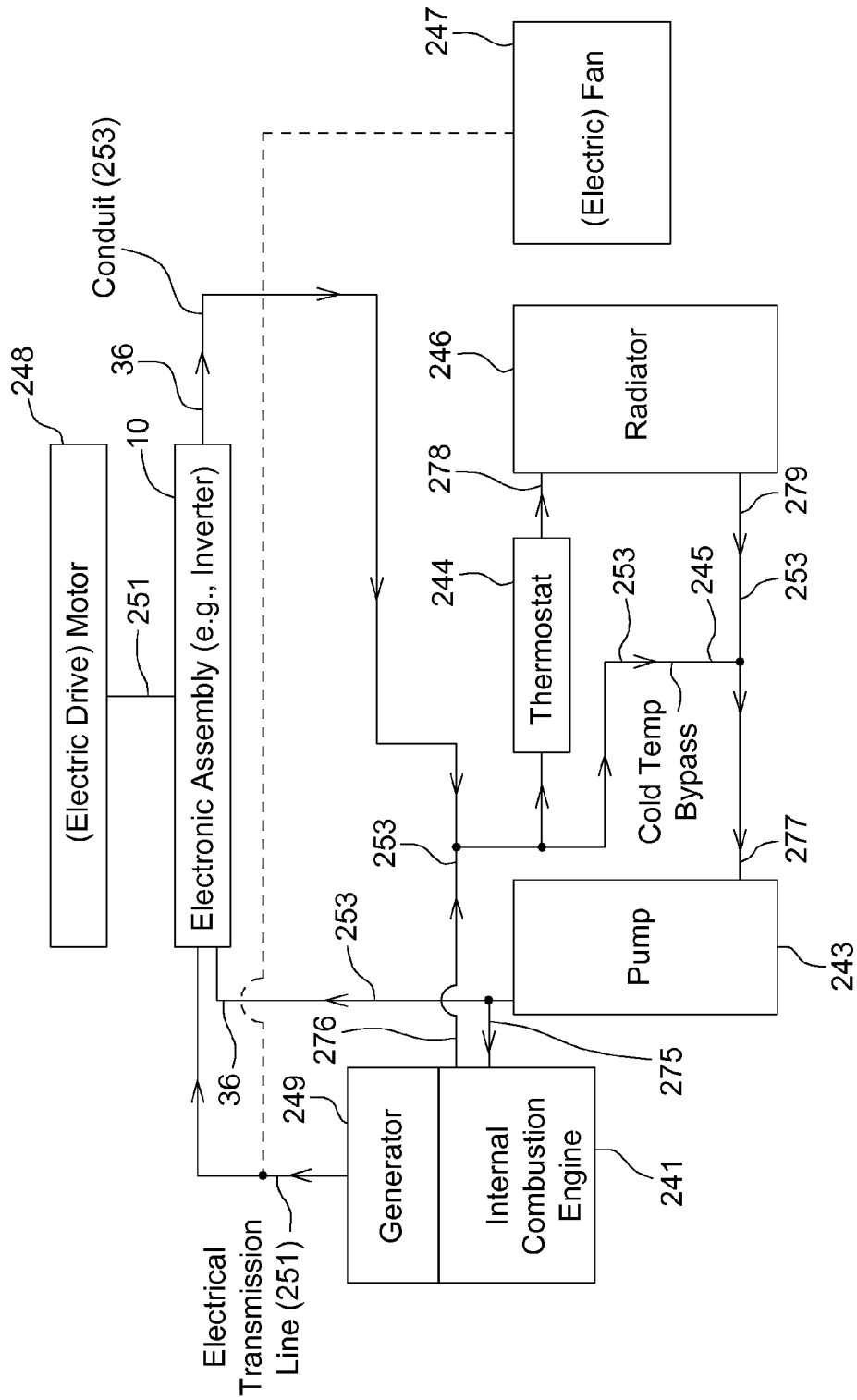
FIG. 10 shows a block diagram of the assembly that shares a coolant system of an internal combustion engine or hybrid vehicle.

FIG. 10 provides an example of how the electronic assembly 10 is incorporated into a hybrid vehicle with an internal combination engine and one or more drive motors 248. In FIG. 10, the electronics assembly 10 uses active cooling. The electronic assembly 10 has an electrical transmission line 251 connected to the input of an motor 248, such as electric drive motor 248 to propel a vehicle. In one example, the electronic assembly 10 receives direct current supply from a generator 249 or energy storage device (e.g., battery) via one or more electrical transmission lines 251. The generator 249 may be mechanically driven or rotated by a shaft (e.g., directly or indirectly the crankshaft) of the internal combustion engine 241.

The internal combustion engine 241 may also provide mechanical, rotational energy or electrical energy to a pump 243 that circulates coolant to one or more inlet ports 36 of the electronic assembly 10 and from one or more outlet ports 36 of the electronic assembly 10. The coolant is also circulated between the inlet 275 and outlet 276 of the engine water jacket (e.g., block or head) of the internal combustion engine 241. In one illustrative configuration, the output port 36 of the electronic assembly 10 and the outlet 276 of the engine water jacket are coupled via conduit 253 to a thermostatic valve 244 and cold temperature bypass line 245. The thermostatic valve 244 opens at preset temperature or preset temperature range to bring the radiator 246 into the cooling circuit. Prior to opening of the thermostatic valve 244, the coolant is routed through the cold temperature bypass line 245 back to the input 277 of the pump 243 to bypass the radiator 246. After the thermostatic value opens at a preset temperature, one or more outlet ports 36 of the electronic assembly 10 are coupled (directly or indirectly) to a radiator inlet 278 of a radiator 246 via conduit 253; similarly, the outlet 276 of the engine water jacket is coupled via conduit 253 to the radiator 246. The radiator 246 has an outlet 279 that is coupled to the pump input 277 of the pump 243. The radiator 246 may be cooled by fan 247 (e.g., electric fan 247), where the fan 247 is powered by a direct current bus via one or more transmission lines 251.

The electronic assembly supports either a separate coolant system from an internal combustion engine coolant loop or using the same coolant system of the internal combustion engine. For a separate coolant system, the maximum inlet temperature can be set to lesser maximum temperature (e.g., 70 degrees Celsius), whereas for the shared coolant system with the internal combustion engine the coolant temperature can be set to a greater maximum temperature (e.g., 105 degrees Celsius). The maximum temperature can be controlled via a thermostatic valve that opens to radiator and an associated fan, for example.

The electronic assembly of this disclosure does not require: (1) a direct bond copper (DBC) connection of a semiconductor device to a separate intervening copper base plate with an adjacent, distinct heat sink mounted to contact the separate base plate with thermally conductive grease, or (2) a direct bond copper connection of terminals of the semiconductor devices 48 to the conductive traces or pads of the circuit board. Here in one embodiment of this disclosure, the semiconductor devices 48 (e.g., semiconductor chipsets) are directly bonded on one or more cold-plates (heat-exchangers), including the first heat sink 30, or its first component 37, without any of use and inefficiency of thermally conductive grease; the terminals of the semiconductor device 48 can be connected to corresponding conductive pads or traces on the circuit board via direct bonding or via a conductive adhesive, soldering, brazing, or welding. Directly bonding of semiconductor devices 48 with one or more cold-plates without any need of DBC, base plate, and thermal grease can significantly reduce thermal resistance between silicon junctions within the semiconductor device 48 and coolant channels, interior, or chambers of the first heat sink 30, for instance.

The electronic assembly of this disclosure is well-suited for double-sided thermal management of the electronic assembly, such as an inverter. Double-sided thermal management has the potential to significantly reduce the thermal resistance for semiconductor devices, capacitors, power devices and components. Further, the electronic assembly facilitates active, thermal management, such as active, single-sided thermal management or double-sided thermal management of the electronic assembly.

The electronic assembly of this disclosure supports a reduced size, weight and cost of inverter because it supports surface-mount manufacturing processes and a generally planar packaging configuration that make the circuit boards amenable to mass, cost effective production.

Having described the preferred embodiment, it will become apparent that various modifications can be made without departing from the scope of the invention as defined in the accompanying claims.

The invention claimed is:

1. An electronic assembly comprising:
a semiconductor device having conductive pads on a device first side and a metallic region on a device second side opposite the first side, wherein an auxiliary metallic region comprises a central metallic region on the device first side;
a lead frame for providing separate terminals that are electrically and mechanically connected to the conductive pads;
a first heat sink comprising a first component having a mating side, a portion of the mating side directly bonded with the metallic region of the semiconductor device and having an opposite side opposite the mating side; and
a circuit board having an opening, the semiconductor device and the lead frame extending at or outward toward a board first side of the circuit board, a board second side of the circuit board opposite the first side, a plurality of board conductive pads being on the board first side of the circuit board to align with the corresponding terminals of the lead frame for electrical connection therewith.

2. The electronic assembly according to claim 1 wherein the conductive pads are arranged at or near a perimeter of the semiconductor device outward from the auxiliary metallic region.

3. The electronic assembly according to claim 1 wherein the opposite side of the first heat sink comprises first protrusions for heat dissipation.

4. The electronic assembly according to claim 1 wherein the board conductive pads comprise metallic layers of greater thickness than other conductive traces on the circuit board.

5. The electronic assembly according to claim 1 wherein the board conductive pads comprise copper or copper alloy pours.

6. The electronic assembly according to claim 1 wherein directly bonded means that the metallic region and the first component of the heat sink are fused, brazed or welded to form an electrical and mechanical connection.

7. The electronic assembly according to claim 1 wherein the heat sink is located at or below the board second side of the circuit board.

8. The electronic assembly according to claim 1 further comprising a current sensor above a conductive strip on the circuit board.

9. The electronic assembly according to claim 1 wherein the current sensor is surrounded by a metallic shield associated with the circuit board.

10. The electronic assembly according claim 1 wherein the lead frame comprises an output terminal that has an interfacing surface that is bonded to the conductive pads of the device and the auxiliary metallic region on the device first side.

11. The electronic assembly according to claim 10 wherein the output terminal is connected to a corresponding conductive strip on the circuit board, where the conductive strip has sufficient size to promote secondary heat dissipation from the output terminal.

12. The electronic assembly according to claim 10 wherein the output terminal has a notch in an interfacing surface of the output terminal.

13. An electronic assembly comprising:
a semiconductor device having conductive pads on a device first side and a metallic region on a device second side opposite the first side;
a lead frame for providing separate terminals that are electrically and mechanically connected to the conductive pads;
a first heat sink comprising a first component having a mating side, a portion of the mating side directly bonded with the metallic region of the semiconductor device and having an opposite side opposite the mating side;
a circuit board having an opening, the semiconductor device and the lead frame extending at or outward toward a board first side of the circuit board, a board second side of the circuit board opposite the first side, a plurality of board conductive pads being on the board first side of the circuit board to align with the corresponding terminals of the lead frame for electrical connection therewith; and
a second heat sink comprising a first member overlying the device first side of the semiconductor device, such that the semiconductor device has thermal pathways for heat transfer or dissipation on both the device first side and the device second side.

14. The electronic assembly according to claim 13 wherein a thermal interface material comprises a dielectric material between the first member of the first heat sink and a terminal of the semiconductor device, wherein the terminal is electrically and mechanically connected to one or more conductive pads on the device first side.

15. The electronic assembly according to claim 13 wherein the second heat sink further comprises:
- a second member that mates with the first member to form an interior chamber;
- a plurality of second protrusions populating the interior chamber and generally spaced apart from each other;
- an inlet and an outlet for communication with the interior chamber to circulate a liquid coolant within the interior chamber.

16. An electronic assembly comprising:
- a semiconductor device having conductive pads on a device first side and a metallic region on a device second side opposite the first side;
- a lead frame for providing separate terminals that are electrically and mechanically connected to the conductive pads;
- a circuit board having an opening, the semiconductor device and the lead frame extending at or outward toward a board first side of the circuit board, a board second side of the circuit board opposite the first side, a plurality of board conductive pads being on the board first side of the circuit board to align with the corresponding terminals of the lead frame for electrical connection therewith;
- a first heat sink comprising a first component having a mating side, a portion of the mating side directly bonded with the metallic region of the semiconductor device and having an opposite side opposite the mating side, the first heat sink comprising:
- a second component with a recess, the second component mating with the first component to form an interior volume;
- a plurality of first protrusions of the first member populating the interior volume and generally spaced apart from each other; and
- an inlet and an outlet for communication with the interior volume to circulate a liquid coolant within the interior volume.

17. The electronic assembly according to claim 16 wherein the first component comprises a lid with the thermal dissipation members extending from one end, where each protrusion comprises a ridge or elevated region that extends outward from a base surface of the lid.

* * * * *